US006754766B1

(12) United States Patent
Schlacter

(10) Patent No.: US 6,754,766 B1
(45) Date of Patent: Jun. 22, 2004

(54) EMULATION OF CONTENT-ADDRESSABLE MEMORIES

(75) Inventor: Guy R. Schlacter, Buffalo Grove, IL (US)

(73) Assignee: Altera Corporation, San Jose, CA (US)

( * ) Notice: Subject to any disclaimer, the term of this patent is extended or adjusted under 35 U.S.C. 154(b) by 218 days.

(21) Appl. No.: 10/076,751

(22) Filed: Feb. 14, 2002

(51) Int. Cl.[7] ............................................. G06F 12/00
(52) U.S. Cl. .................. 711/108; 711/216; 365/230.02; 326/40
(58) Field of Search ................................ 711/108, 216; 703/13, 14, 15, 16, 21, 22, 23; 717/134; 712/227; 714/28, 29; 365/49; 326/40, 41

(56) References Cited

U.S. PATENT DOCUMENTS

| | | | | |
|---|---|---|---|---|
| 4,244,033 A | * | 1/1981 | Hattori | 711/108 |
| 5,550,782 A | | 8/1996 | Cliff et al. | 365/230.03 |
| 5,940,597 A | * | 8/1999 | Chung | 709/242 |
| 6,020,759 A | | 2/2000 | Heile | 326/40 |
| 6,118,720 A | * | 9/2000 | Heile | 365/230.01 |
| 6,144,573 A | | 11/2000 | Heile | 365/49 |
| 6,278,289 B1 | | 8/2001 | Guccione et al. | 326/40 |
| 6,308,218 B1 | * | 10/2001 | Vasa | 709/238 |
| 6,344,989 B1 | | 2/2002 | Heile | 365/49 |
| 6,351,143 B1 | * | 2/2002 | Guccione et al. | 326/40 |
| 6,353,332 B1 | * | 3/2002 | Brelet | 326/40 |
| 6,356,110 B1 | | 3/2002 | Reddy et al. | 326/41 |
| 6,556,500 B2 | * | 4/2003 | Heile | 365/230.03 |
| 2002/0057621 A1 | * | 5/2002 | Heile | 365/230.01 |

OTHER PUBLICATIONS

"Apex 20KC Programmable Logic Device", Data Sheet, Mar. 2001, ver. 1.0, Altera Corporation, San Jose, CA, pp. 1, and 24–35.

"Apex II Programmable Logic Device Family", Data Sheet, Apr. 2001, ver. 1.0, Altera Corporation, San Jose, CA, pp. 1, and 24–36.

"Apex 20K Programmable Logic Device Family", Data Sheet, Aug. 2001, ver. 4.0, Altera Corporation, San Jose, CA, pp. 1, and 25–36.

J.–L. Brelet, "An Overview of Multiple CAM Designs in Virtex Family Devices," Application Note XAPP201, Sep. 23, 1999 (Version 1.1), Xilinx, Inc., San Jose, CA. p. 1–6.

M. Defossez, "Content Addressable Memory (CAM) in ATM Applications," Application Note: Virtex Series and Virtex II Series XAPP202 (v1.2) Jan. 6, 2001, Xilinx, Inc., San Jose, CA. p. 1–12.

J.–L. Brelet et al., "Designing Flexible, Fast CAMs with Virtex Family FPGAs," Application Note XAPP203, Sep. 23, 1999 (Version 1.1), Xilinx, Inc., San Jose, CA. p. 1–17.

J.–L. Brelet, "Using Block RAM for High Performance Read/Write CAMs," Application Note: Virtex Series XAPP204 (v1.2) May 2, 2000, Xilinx, Inc., San Jose, CA. p. 1–19.

\* cited by examiner

Primary Examiner—Donald Sparks
Assistant Examiner—Brian R. Peugh
(74) Attorney, Agent, or Firm—Fish & Neave; Robert R. Jackson

(57) ABSTRACT

Circuitry that includes blocks of memory can be used to emulate a content addressable memory ("CAM"). The CAM data is stored in enough blocks of memory so that all of that data can be gradually read out in the time allowed for completion of a CAM search. As the data is read out, it is compared to CAM search data. If and when a match is found, a CAM address associated with the CAM data found to match the search data is generated. Alternatively or in addition, a simple "match" signal may be generated. If desired, the contents of the emulated CAM may be changed. To do this, circuitry is provided for converting the CAM address of the new data to an appropriate physical address (in the above-mentioned memory blocks) for that data.

28 Claims, 14 Drawing Sheets

| LINE | USER REQUIREMENTS | VARIABLE | CALCULATION (INTEGERS) | COMMENTS |
|---|---|---|---|---|
| 1 | CAM SIZE | N×M BITS | N.A. | |
| 2 | CAM DEPTH OF M-BIT WORDS | N | N.A. | |
| 3 | CAM WIDTH IN BITS | M | N.A. | |
| 4 | MATCH/SEARCH DATA CLK RATE | F MHZ | N.A. | |
| 5 | HOW MANY CLKS BETWEEN MATCH/SEARCHES? | K CLKS | N.A. | HOW OFTEN IS DATA SEARCHED? |
| 6 | ALLOWED SEARCH CYCLES (LATENCY FROM BEGIN OF SEARCH) | C | DEFAULT = MIN = 1, MAX = K + ALLOWED LATENCY | SUBJECTIVE DELAY FOR MATCH |
| 7 | MEMORY FREQUENCY LIMIT | L | E.G., 300 MHZ OR 312 MHZ | |
|  | CALCULATIONS | | | |
| 8 | PERFORMANCE RATIO | R | TRUNCATE (L/F) | |
| 9 | DEPTH OF EMULATING MEM. | D | MIN(R*C, N) | |

FIG. 1a

| | | | |
|---|---|---|---|
| 10 | WIDTH IN WORDS OF EMULATING MEM. (M BITS EA.) | W | |
| 11 | BYTE ENABLES PER WORD | BEN | E.G., CEIL(M/9) |
| 12 | BLOCKS OF MEMORY NEEDED | B | E.G., CEIL((W*BEN/2),1) * CEIL((D/(512/(BEN*8))),1) <br><br> OR <br><br> E.G., CEIL((W*BEN/2),1) * CEIL((D/4096/BEN*8))),1) | FOR 512 BIT MEM. BLOCKS WITH 16 BIT PARALLEL OUTPUT <br><br> OR <br><br> FOR 4K BIT MEM BLOCKS WITH 32 BIT PARALLEL OUTPUT |
| 13 | EMULATION CAM CLOCK | CCLK | F*R | |
| 14 | ~EMULATING MEM ARRAY SIZE | AS | D*(W*BEN*9) BITS, BUT ACTUAL BUILT WIDTH MAY BE BIGGER WITH UNUSED BITS | ACTUAL ARRAY BUILT MAY BE WIDER WHEN INCLUDING UNUSED BITS |

NOTES: TRUNCATE = ROUND DOWN TO NEAREST INTEGER WHEN VALUE > INTEGER.
CEIL = ROUND UP TO NEXT HIGHER INTEGER IF VALUE > NEXT LOWER INTEGER.

FIG. 1b

| LINE | USER REQUIREMENTS | VARIABLE | CALCULATION (INTEGERS) | VALUE |
|---|---|---|---|---|
| 1 | CAM SIZE | NxM BITS | N.A. | 256x16 BITS |
| 2 | CAM DEPTH OF M-BIT WORDS | N | N.A. | 256 |
| 3 | CAM WIDTH IN BITS | M | N.A. | 16 |
| 4 | MATCH/SEARCH DATA CLK RATE | F MHZ | N.A. | 50 |
| 5 | HOW MANY CLKS BETWEEN MATCH/SEARCHES? | K CLKS | N.A. | 64 |
| 6 | ALLOWED SEARCH CYCLES (LATENCY) | C | DEFAULT = MIN = 1, MAX = K+ALLOWED_LATENCY | 1 |
| 7 | MEM. FREQ. LIMIT | L | 312 MHz | 312 |
|   | CALCULATIONS |   |   |   |
| 8 | PERFORMANCE RATIO | R | TRUNCATE(L/F) | 6 |
| 9 | DEPTH OF EMULATING MEM. | D | MIN(R*C, N) | 6 |

FIG. 2a

| 10 | WIDTH IN WORDS OF EMULATING MEM. (M BITS EA.) | W | CEIL(N/D) | 43 |
| --- | --- | --- | --- | --- |
| 11 | BYTE ENABLES PER WORD | BEN | CEIL(M/9) | 2 |
| 12 | BLOCKS OF 512-BIT MEMORY NEEDED | B | CEIL((W*BEN/2),1)* CEIL((D/(512/(BEN*B))),1) | 43 |
| 13 | EMULATION CAM CLOCK | CCLK | F*R | 300 |

FIG. 2b

| LINE | USER REQUIREMENTS | VARIABLE | CALCULATION (INTEGERS) | VALUE |
|---|---|---|---|---|
| 1 | CAM SIZE | N×M BITS | N.A. | 256×16 BITS |
| 2 | CAM DEPTH IN M-BIT WORDS | N | N.A. | 256 |
| 3 | CAM WIDTH IN BITS | M | N.A. | 16 |
| 4 | MATCH/SEARCH DATA CLK RATE | F MHz | N.A. | 50 |
| 5 | HOW MANY CLKS BETWEEN MATCH/SEARCHES? | K CLKS | N.A. | 64 |
| 6 | ALLOWED SEARCH CYCLES (LATENCY) | C | DEFAULT=MIN=1 MAX=K+ALLOWED_LATENCY | 10 |
| 7 | MEM. FREQ. LIMIT | L | 312 MHz | 312 |
|  | CALCULATIONS |  |  |  |
| 8 | PERFORMANCE RATIO | R | TRUNCATE(L/F) | 6 |
| 9 | DEPTH OF EMULATING MEM. | D | MIN(R*C, N) | 60 |

FIG. 4a

| 10 | WIDTH IN WORDS OF EMULATING MEM. (M BITS EA.) | W | CEIL(N/D) | 5 |
|---|---|---|---|---|
| 11 | BYTE ENABLES PER WORD | BEN | CEIL(M/9) | 2 |
| 12 | BLOCKS OF 512-BIT MEMORY NEEDED | B | CEIL((W*BEN/2),1) * CEIL((D/(512/(BEN*8))),1) | 10 |
| 13 | EMULATION CAM CLOCK | CCLK | F*R | 300 |

FIG. 4b

EMULATION OF CONTENT-ADDRESSABLE MEMORIES

BACKGROUND OF THE INVENTION

This invention relates to memory circuits, and more particularly to memory circuits of the type known as content-addressable memories.

A content-addressable memory ("CAM") is a memory that can store a plurality of different data words in respective different address locations in the memory. When a search data word is applied to the CAM, the CAM outputs the address of the location (if any) in the CAM that contains that data word, or the CAM may output a simple "match" signal. CAMs are also sometimes referred to as associative memories, but CAM is the term chosen for use herein.

Many programmable logic device integrated circuits ("PLDs") include blocks of memory that can be used in any of several different ways. For example, such memory blocks may be usable as single- or multi-port random access memory ("RAM"), read-only memory ("ROM"), or product-term ("Pterm") logic, etc. (See, for example, Heile U.S. Pat. No. 6,020,759.) It is even known to give such memory blocks the capability of optionally operating as CAMs. (See, for example, Heile U.S. Pat. No. 6,144,573.) Although significant, the demand for CAM capability tends to be less than the demand for other types of memory capability, so it can be uneconomical to include, in a PLD, circuitry that is dedicated to supporting CAM capability. Also, it can be difficult or impossible to provide such dedicated circuitry that is capable of efficiently supporting very large CAMs and/or CAMs requiring changes to the data stored in the CAM.

In view of the foregoing, one aspect of the present invention relates to using circuitry on a PLD that does not include dedicated CAM capability to allow the PLD to emulate a CAM. The invention will be illustratively described primarily in such a PLD context. But it will be understood that the invention is also applicable to emulating CAM capability in other contexts, such as in application-specific integrated circuits ("ASICs") that include suitable memory resources (e.g., RAM or ROM) and systems that include multiple integrated circuits (e.g., systems that include multiple RAM or ROM chips).

SUMMARY OF THE INVENTION

In accordance with the present invention CAMs are implemented in PLDs by configuring (i.e., programming) the PLD to emulate the required CAM. The CAM data is stored in memory blocks in the PLD. The programmable logic of the PLD is used to control such functions as storage of the CAM data in the memory blocks, retrieval of the CAM data from the memory blocks for comparison to search data, and the actual comparisons of CAM data and search data. As part of the storage of CAM data in the memory blocks, the programmable logic of the PLD may convert CAM addresses to actual memory block addresses. Similarly, as part of the retrieval of CAM data from the memory blocks and comparison of that data to search data, the programmable logic of the PLD may convert the actual memory block address of CAM data that matches the search data to a CAM address. Time-division multiplexing ("TDM") may be used in comparing the CAM data to the search data. Circuitry on the PLD (e.g., phase locked loop ("PLL") circuitry and programmable logic circuitry) may be used to provide a faster clock signal for use in these TDM operations. In each cycle of the faster clock signal, multiple CAM data words may be retrieved in parallel from the memory blocks and compared in parallel to the search data.

As an alternative to the foregoing, the invention may be similarly applied to other circuitry having memory blocks generally like those on a PLD as described above. Such other circuitry may be an ASIC or a system including multiple memory chips (integrated circuits).

Further features of the invention, its nature and various advantages will be more apparent from the accompanying drawings and the following detailed description.

BRIEF DESCRIPTION OF THE DRAWINGS

FIGS. 1a and 1b are collectively a table showing several parameters useful in explaining certain aspects of the invention.

FIGS. 2a and 2b are collectively a table similar to FIGS. 1a and 1b, but for a particular illustrative example of a CAM to be implemented by emulation in accordance with the invention.

FIGS. 4a and 4b are similar to FIGS. 2a and 2b, but for another illustrative example of a CAM to be implemented by emulation in accordance with the invention.

DETAILED DESCRIPTION

Figure 3:
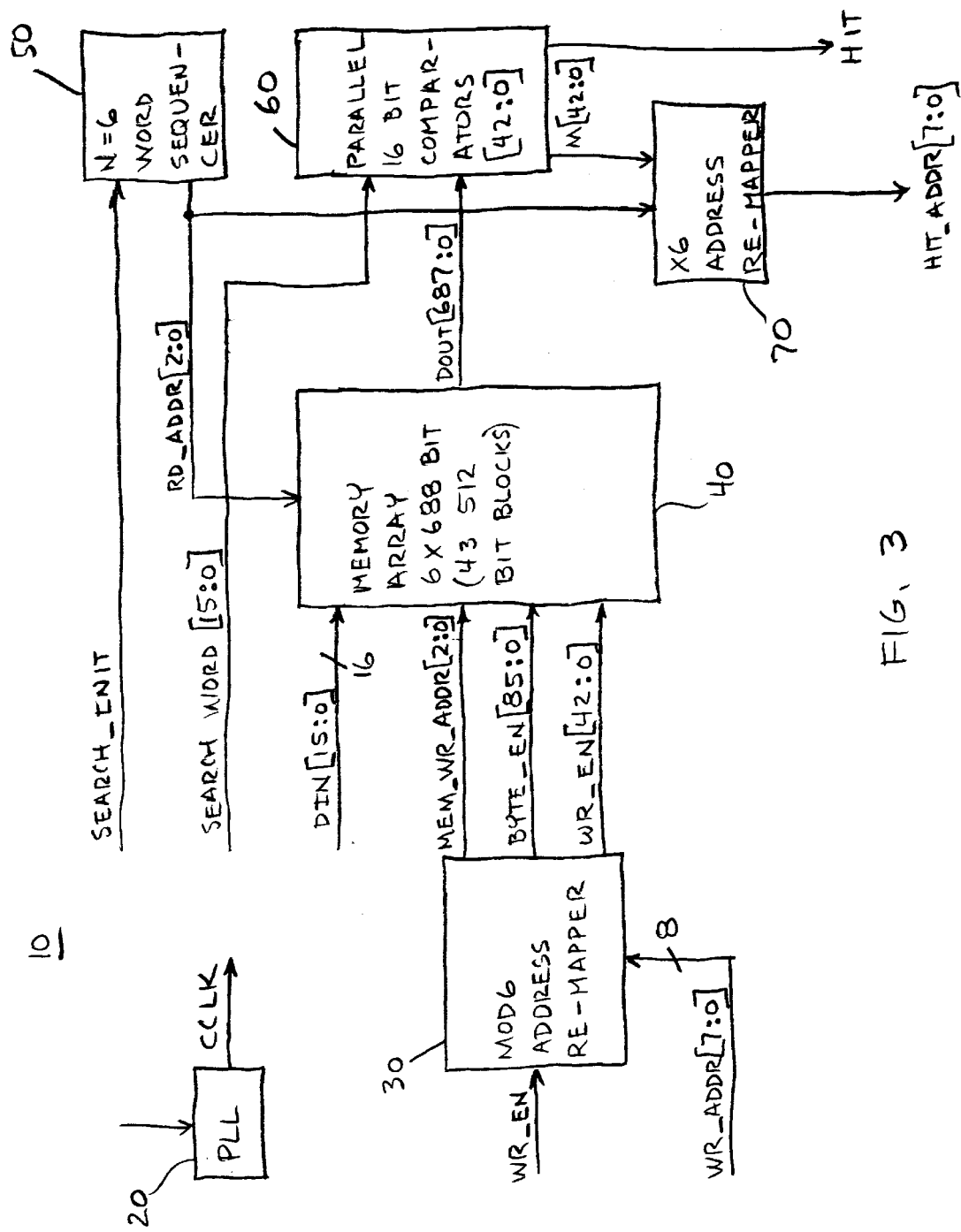
FIG. 3 is a simplified schematic block diagram of an illustrative PLD implementation (by emulation) of the CAM specified in FIGS. 2a and 2b in accordance with the invention.

A PLD architecture in which this invention can be implemented is shown in Cliff et al. U.S. Pat. No. 5,550,782. It will be understood, however, that this PLD architecture is only one example of PLD architectures in which this invention can be implemented, and that any other suitable PLD architecture can be employed if desired. Also, as has been said, the invention can be alternatively implemented in contexts other than PLDs (e.g., in suitable ASICs and systems including multiple memory chips). Such other possible uses will be fully understood from the following description, which deals mostly with illustrative PLD embodiments of the invention.

FIGS. 1a and 1b are collectively a table showing several parameters that are involved in configuring a PLD (or, analogously, any other circuitry (e.g., an ASIC or multi-chip system) with suitable resources) to emulate a CAM in accordance with this invention. The heading of the fourth column indicates that all parameter values are expected to be integers. Two functions ("truncate" and "ceil") may be used to force certain calculations to integer values. In particular, the truncate function rounds a non-integer value down to the next lower integer value, and the ceil function rounds a non-integer value up to the next higher integer value. A third function ("min") selects the lower of two indicated values.

Lines 1–3 in FIG. 1a indicate that the user may specify the size of the CAM to be implemented. In particular, the user may specify the number of words, N, in the CAM and the number of bits, M, in each word in the CAM. For example, N may be 256 and M may be 16.

Line 4 in FIG. 1a indicates that the user may specify a basic clock rate, F (in MHz), at which the CAM will be searched. For example, F may be a basic clock rate (e.g., 50 MHz) at which other operations are being performed on the PLD.

Line 5 in FIG. 1a indicates that the user may specify how many cycles, K, (at the F clock rate) there will be between searches of the CAM.

Line 6 in FIG. 1a indicates that the user may specify a number of cycles, C, of the match search rate F within which the search of the CAM must be completed. For example, the user may specify that the search must be completed within 1, 2, 5, or 10, etc., cycles of the match search rate F. The default value of C is 1. The maximum value that C can have is K plus an allowance for the time required to output an indication that a match has been found.

Line 7 in FIG. 1a indicates that the user may specify the maximum frequency, L (in MHz), at which the memory blocks on the PLD can operate. At the upper limit, this value may be dictated by operational limits of the PLD. For example, the maximum value that L can have for certain PLDs may be 300 MHz. For certain other PLDs the maximum value that L can have may be 312 MHz.

The remaining lines (8–14) in FIGS. 1a and 1b are for calculated values, rather than user-specified values.

Line 8 in FIG. 1a indicates that a performance ratio, R, is calculated by truncating the quotient of L divided by F. For example, if L is 300 MHz or 312 MHz and F is 50 MHz, R will be 6.

Line 9 in FIG. 1a indicates that the depth, D, of the memory emulating the CAM is the lesser of (1) R times C and (2) N. D is the number of times the memory emulating the CAM will have to be accessed to complete a CAM search. For example, if the user permits C to be larger than 1, the memory emulating the CAM can be deeper, which may permit fewer memory blocks in the PLD to be used in the CAM emulation. Increasing R has a similar effect on the depth of the memory emulating the CAM.

Line 10 in FIG. 1b (line numbering continues from FIG. 1a) indicates that the width, W, of the memory emulating the CAM is calculated from the quotient of N divided by D. If this quotient is a non-integer value, it is rounded up by the ceil function or operator to produce W as the next higher integer value. In general terms, W indicates how much the original depth N of the CAM must be spread out over the emulating memory so that the depth D of the emulating memory does not exceed the number of successive read cycles that is allowed for completion of a search. The spreading out referred to in the preceding sentence is to some degree a transformation of original CAM depth N to emulating memory width W.

Line 11 in FIG. 1b indicates that the number of byte enables per word, BEN, is calculated based on the quotient of M divided by the number of bits in each "byte" in the memory used to emulate the CAM. In the example mentioned in FIG. 1b, the divisor is 9, which is appropriate for the memory blocks in certain PLDs ("bytes" of eight bits plus a parity bit). Another example of a possible divisor value is 8, which would be appropriate for the memory blocks in certain other PLDs. If the quotient in this line of FIG. 1b is not an integer, then the ceil operator causes the value of BEN to be rounded up to the next higher integer value. For example, if M is 16 and the divisor is 8 or 9, BEN is 2.

Line 12 in FIG. 1b indicates calculation of the number of blocks of memory on the PLD needed to emulate the CAM. As this line of FIG. 1b shows, this number, B, is the product of two terms. The second of these two terms is based on the quotient of D divided by a measure of the depth of each memory block on the PLD. This term reflects the fact that if D exceeds the depth of a memory block, then the emulating memory will have to be two or more blocks deep. FIG. 1b shows two examples in which the memory block depths are basically 32 or 128, respectively, but other memory block depths are equally possible. The ceil operator is used on the quotient in this second term (which cannot be less than 1).

The first term on which the calculation of B is based is a measure of how many memory blocks will be required so that collectively all of those memory blocks can output in parallel all of the CAM data that must be examined in any one of the read cycles available to complete a search. More specifically, this first term is based on the product of W and a measure of the width of the output port of each memory block. This measure of output port width is given by the quotient of BEN divided by the number of bytes a memory block can output in parallel. FIG. 1b shows examples in which the memory block output port widths are 2 or 4 bytes, but other memory block output port widths are equally possible. The ceil operator is also used in the first term in the calculation of B (which again cannot be less than 1).

Line 13 in FIG. 1b shows that the clock signal frequency, CCLK, used in the emulation of the CAM is calculated as the product of F and R. CCLK is the read cycle frequency used for reading the memory emulating the CAM during a search. CCLK cannot, of course, exceed L, and the manner in which CCLK is calculated prevents that from being attempted.

Line 14 in FIG. 1b shows calculation of the size, AS, of the memory array used to emulate the CAM.

FIGS. 2a and 2b are collectively a table similar to FIGS. 1a and 1b, but for a specific illustrative example of a CAM to be implemented by emulation in accordance with this invention. In the example of FIGS. 2a and 2b the CAM includes 256 words of 16 bits each. The rate at which searches can be completed is 50 MHz (because F is 50 MHz and C is only 1). The frequency L at which the PLD memories can be accessed is limited to 312 MHz. R and D are both 6. W is 43. BEN is 2. The number of blocks B of memory required to emulate the CAM is 43, and CCLK is 300.

FIG. 3 shows an illustrative implementation of the CAM specified in FIGS. 2a and 2b in an illustrative PLD 10. It will be understood that FIG. 3 tends to show only the portions of the circuitry on PLD 10 that are directly involved in implementing the CAM, and that PLD 10 may also include substantial amounts of other circuitry such as other PLL circuits, other programmable logic blocks, other memory blocks, input/output circuitry, etc.

In the illustrative embodiment shown in FIG. 3, PLL 20 on PLD 10 provides the CCLK signal at 312 MHz. PLL 20 may do this by operating on a 312 MHz input clock signal, or by applying an appropriate scale factor to an input clock signal having some other frequency.

Block 40 in FIG. 3 represents 43 blocks of memory on PLD 10. Each of these memory blocks is assumed (1) to be able to store 512 bits of data (not counting parity bits), (2) to be able to output in parallel two "bytes" of nine bits each (i.e., eight data bits plus a parity bit), and (3) to have a depth of 32. The memory blocks in block 40 can be either single- or dual-port memory blocks.

The other elements in FIG. 3 (i.e., elements 30, 50, 60, and 70) can be variously implemented by use of the programmable logic and/or other memory blocks of PLD 10.

Element 30 is the primary element for writing data into the memory blocks 40 used to implement the CAM. The data to be written to the search table is supplied in parallel via the 16 leads labelled DIN[15:0]. The CAM address of a particular data word in the data storage table is supplied to element 30 via the eight parallel leads labelled WR_ADDR [7:0]. A write enable signal WR_EN is also applied to element 30. Element 30 re-maps the eight-bit CAM address WR_ADDR[7:0] to three groups of signals. The 43 WR_EN [42:0] signals select one of the 43 memory blocks in elements 40 to receive the data. The three MEM_WR_ ADDR[2:0] signals select the one of six "rows" in the selected memory block that is to receive the data. And the 86 BYTE_EN[85:0] signals select the specific (two) byte location(s) in the selected "row" that will receive the data. (In this particular example there are two byte enables per word.) It will thus be seen that element 30 controls the routing of input data from a CAM organization in which each 16-bit word is associated with a respective one of 256 CAM addresses (WR_ADDR[7:0]) to a different organization in portions of each of 43 memory blocks in element 40. In particular, six CAM "long data words" are respectively stored in six "rows" in each of the 43 memories so that collectively all 256 CAM data words can be stored no more that six deep in the 43 memories. The translation between the WR_ADDR[7:0] signals, on the one hand, and the MEM_WR_ADDR[2:0], BYTE_EN[85:0], and WR_EN [42:0] signals, on the other hand, is performed (as has been said) by element 30. Element 30 can be implemented using programmable logic of PLD 10 and/or by employing one or more memory blocks of the PLD as a large look-up table.

Elements 50, 60, and 70 are used to conduct CAM searches on the CAM data stored in element 40. The word for which the CAM is to be searched is applied via leads SEARCH WORD[15:0]. A search is then initiated by asserting the SEARCH_INIT signal to word sequencer 50. This causes element 50 to successively output six read addresses via leads RD_ADDR[2:0]. These six addresses are the addresses that are appropriate for successively reading the six "rows" in the memories in element 40 that contain CAM data. These addresses are output in sequence in synchronism with six successive cycles of the CCLK signal. Because one row in all 43 memories are read simultaneously, element 40 outputs in parallel 43 16-bit data words during each CCLK cycle. The DOUT[687:0] leads are use for these outputs.

Each of the 43 16-bit data words output by element 40 in a given CCLK cycle is applied to a respective one of 43 parallel 16-bit comparators represented by element 60. The SEARCH WORD[15:0] signals are also applied to these 43 comparators. If the two 16-bit words applied to any of the comparators in element 60 are determined by that comparator to match one another, the comparator finding the match outputs a match-indicating signal on the one of 43 leads M[42:0] associated with that comparator. The HIT output signal of element 60 is also asserted when any match is found.

Element 70 reconstructs the original CAM address HIT_ ADDR[7:0] from the RD_ADDR[2:0] and M[42:0] signals that occur when a match has been found. This can be done by element 70 because when a match is found, the row (indicated by the current RD_ADDR[2:0] signals) and the memory (indicated by the current M[42:0] signals) in which the matching data was found uniquely identifies the original CAM address of the matching data. Element 70 can thus effectively reverse and encode the translation performed by element 30 when the CAM data is first written into the memories in element 40.

From the foregoing it will be seen that the CAM emulation shown in FIG. 3 can complete a CAM search of 256 16-bit CAM data words in six CCLK cycles and can output the CAM address of any data word found to match the search word.

FIGS. 4*a* and 4*b* are similar to FIGS. 2*a* and 2*b*, but for another specific illustration of a CAM to be implemented by emulation in accordance with this invention. The major difference between the example of FIGS. 4*a* and 4*b* and the example of FIGS. 2*a* and 2*b* is that FIGS. 4*a* and 4*b* allow ten 50 MHz cycles for completion of a CAM search, rather than only one 50 MHz cycle as in FIGS. 2*a* and 2*b*. This means that the emulating memory can be 60 "rows" deep, rather than only six "rows" deep as in FIG. 2. Because 60 search cycles are allowed to complete a search, only five words (out of 256) need to be compared in any given search cycle. However, ten blocks of 512-bit memory are needed to store all the CAM data. The memory must support 60 rows of data, and efficiency is achieved by putting each memory in a 64-by-9 mode.

Figure 5:
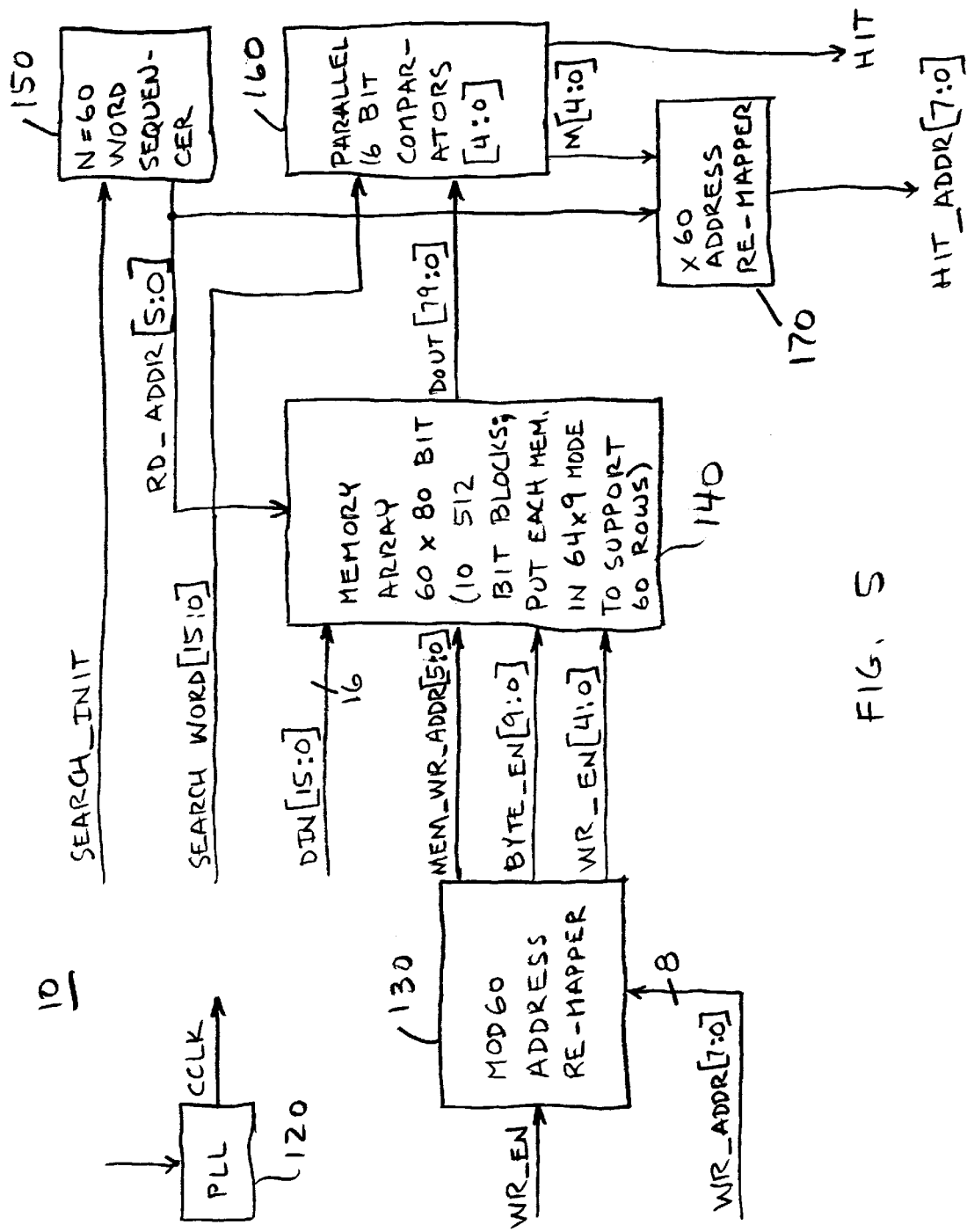
FIG. 5 is similar to FIG. 3, but for the CAM specified in FIGS. 4a and 4b.

FIG. 5 is similar to FIG. 3, but shows implementation of the CAM specified in FIGS. 4*a* and 4*b*. Elements in FIG. 5 that are similar to elements in FIG. 3 have reference numbers that are increased by 100 from the reference numbers used in FIG. 3. Because of this basic similarity to what has already been discussed, it will not be necessary to provide again in connection with FIG. 5 all the detail that has already been provided in connection with FIG. 3.

In FIG. 5 element 140 includes ten blocks of the same type of memory that is used in element 40 in FIG. 5. Element 130 addresses these memories for purposes of writing CAM data into them. In particular, element 130 produces the following signals from each eight-bit CAM address (WR_ ADDR[7:0]) applied to it: MEM_WR_ADDR[5:0], BYTE_EN[9:0], and WR_EN[4:0]. The five WR_EN[4:0] signals select which one of five pairs of memory blocks in element 140 will receive the DIN[15:0] data word. The six MEM_WR_ADDR[5:0] signals select which one of the 60 "rows" being used in each pair of memory blocks in element 140 will receive the data word. The ten BYTE_EN[9:0] signals select which bytes in the selected memory pair and "row" will actually receive the DIN[15:0] data.

When a search of the CAM is to be conducted, the 16-bit word to be searched for is applied via leads SEARCH WORD[15:0). The search is then initiated by asserting the SEARCH_INIT signal. This causes element 150 to successively output 60 sequential read addresses via leads RD_ADDR[5:0]. Each successive read address is synchronized with a respective one of 60 cycles in the CCLK signal from element 120. These read addresses successively address the 60 rows of memory in element 140 that contain CAM data. Element 140 outputs five 16-bit words via leads DOUT[79:0] in response to each read address. Each of these five words is compared in a respective one of five comparators in element 160 to the word being searched for (supplied, as mentioned above, via leads SEARCH WORD[15:0]). The memory pair from which the matching word came is indicated by the assertion of the appropriate one of the five signals M[4:0]. The HIT signal is also asserted whenever a match is found. Element 170 converts the information represented by the RD_ADDR[5:0] and M[4:0] signals when a match is found to produce the HIT_ADDR[7:0] signals indicative of the CAM address of the word found to match the search word. As in FIG. 3, element 170 performs this function by effectively reversing the translation from CAM address to physical memory address performed by element 130.

Figure 6:
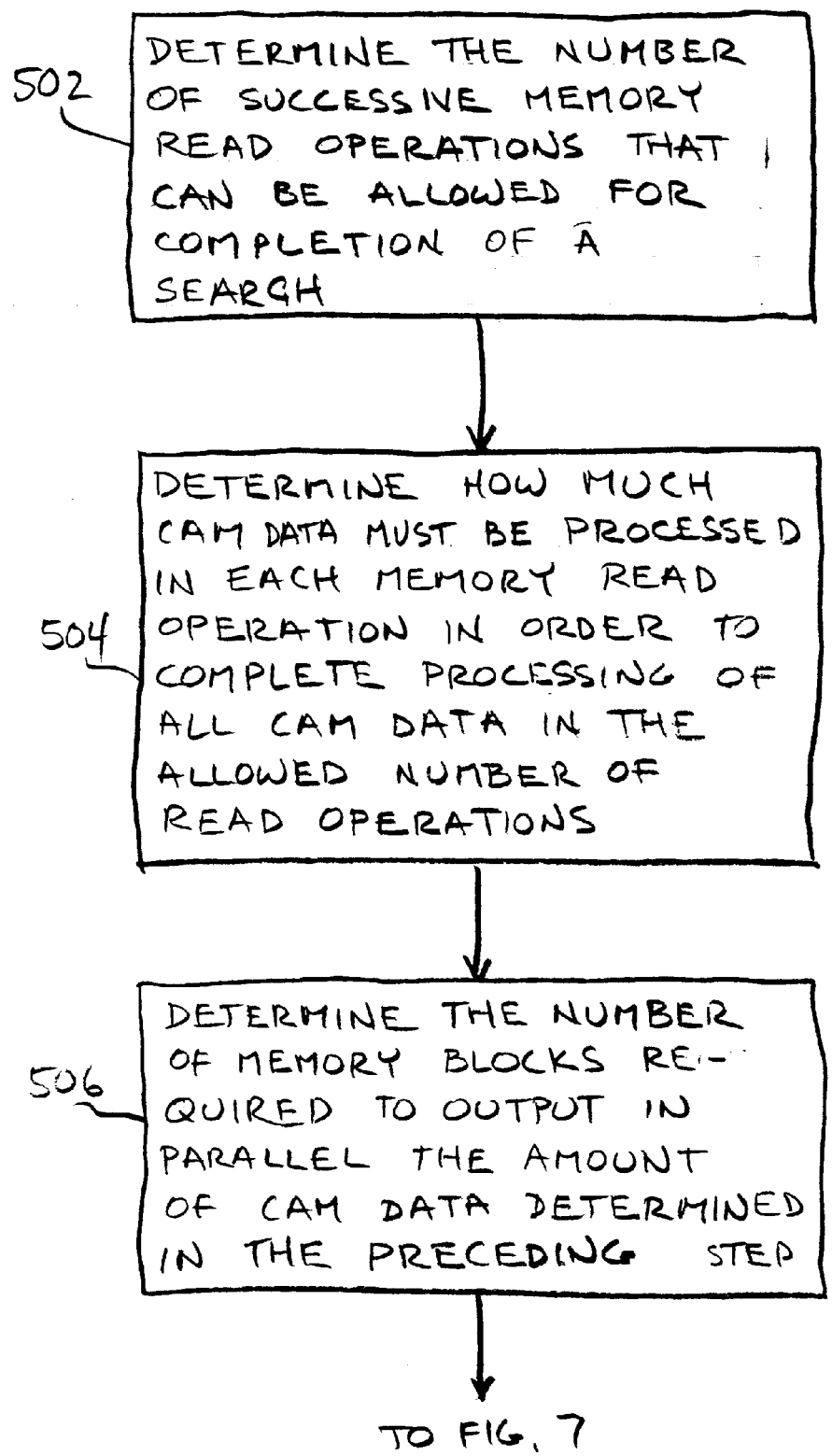
FIG. 6 is a simplified flow chart of a portion of an illustrative method for effecting a CAM emulation in accordance with the invention.
Figure 7:
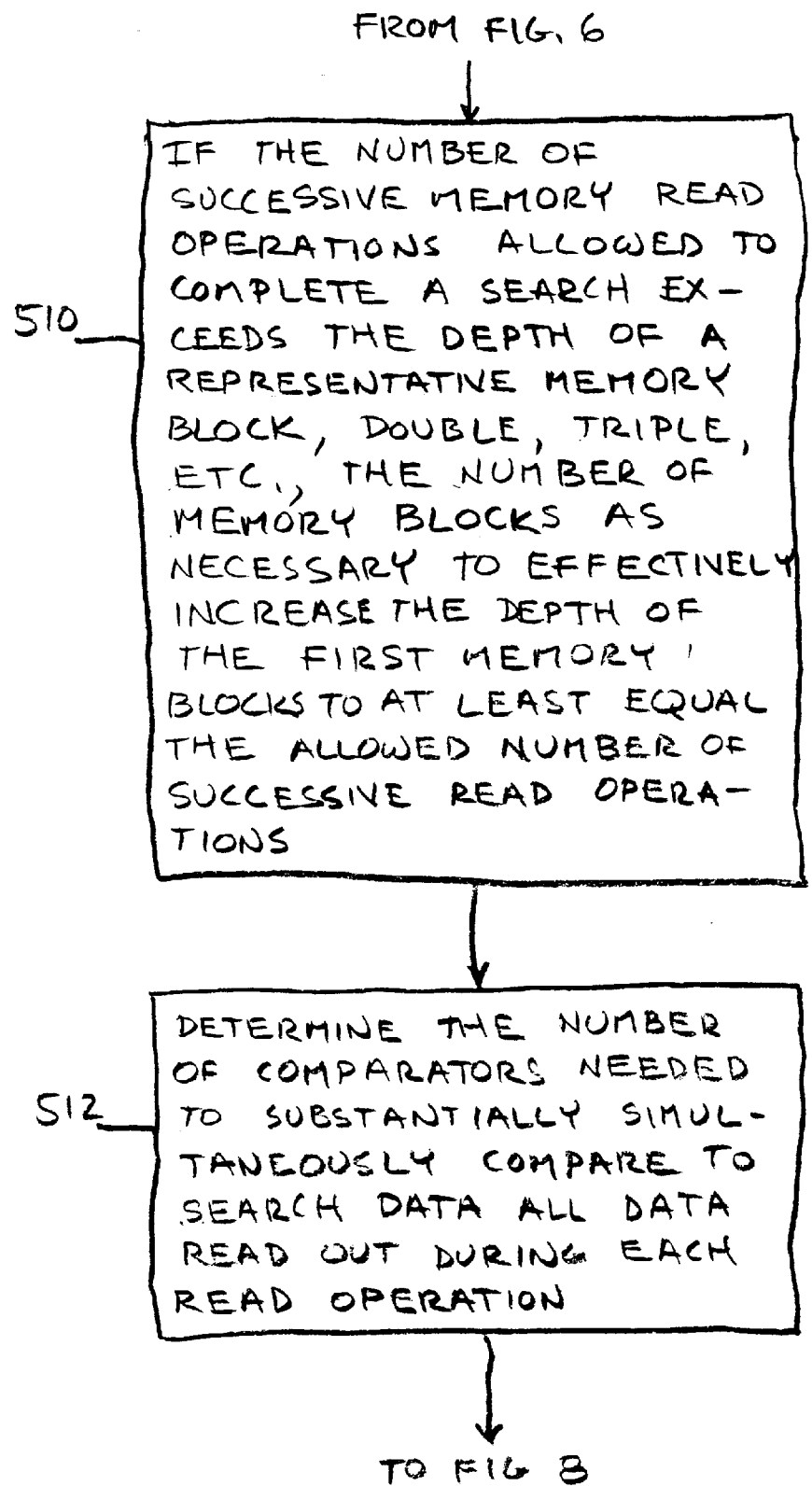
FIG. 7 is a continuation of FIG. 6.
Figure 8:
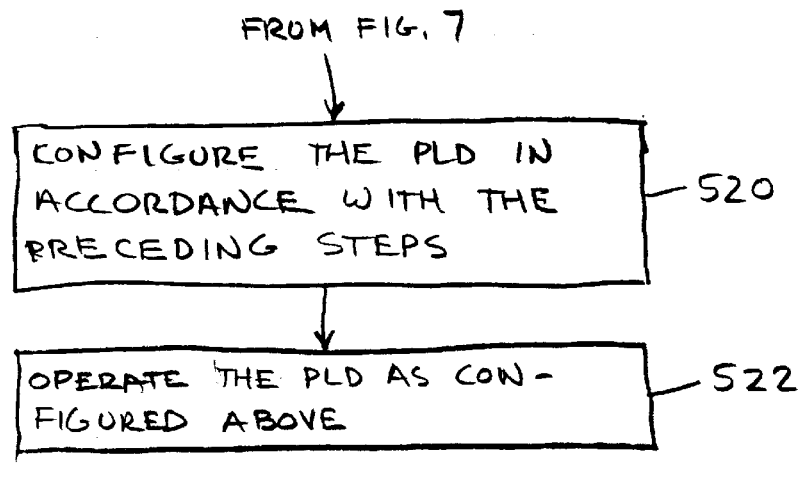
FIG. 8 is a continuation of FIG. 7.
Figure 9:
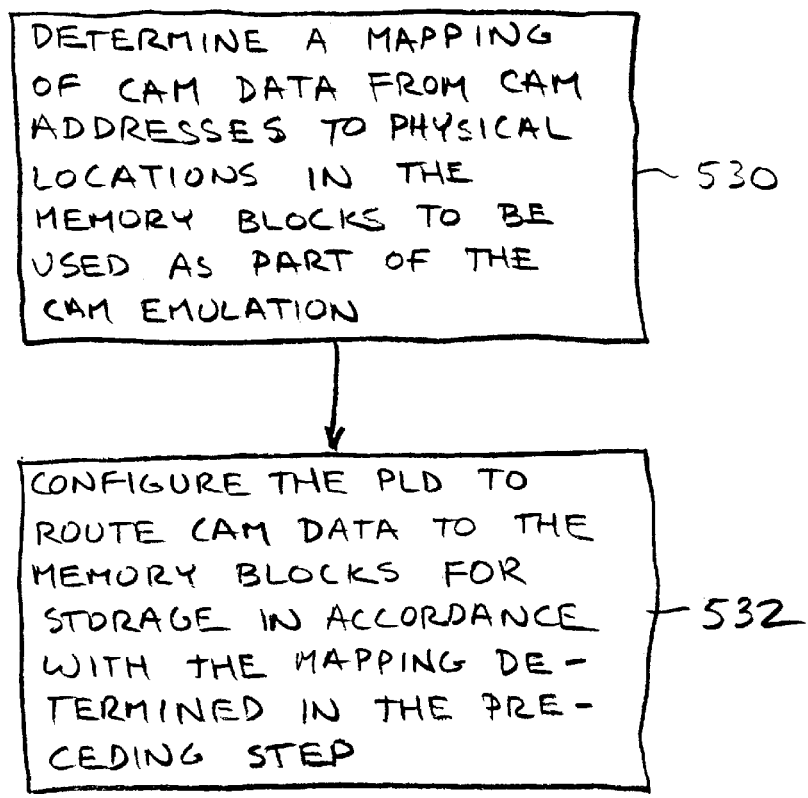
FIG. 9 is similar to FIGS. 6–8, but shows some optional additional steps that can be included in methods of the type illustrated by FIGS. 6–8 in accordance with the invention.
Figure 10:
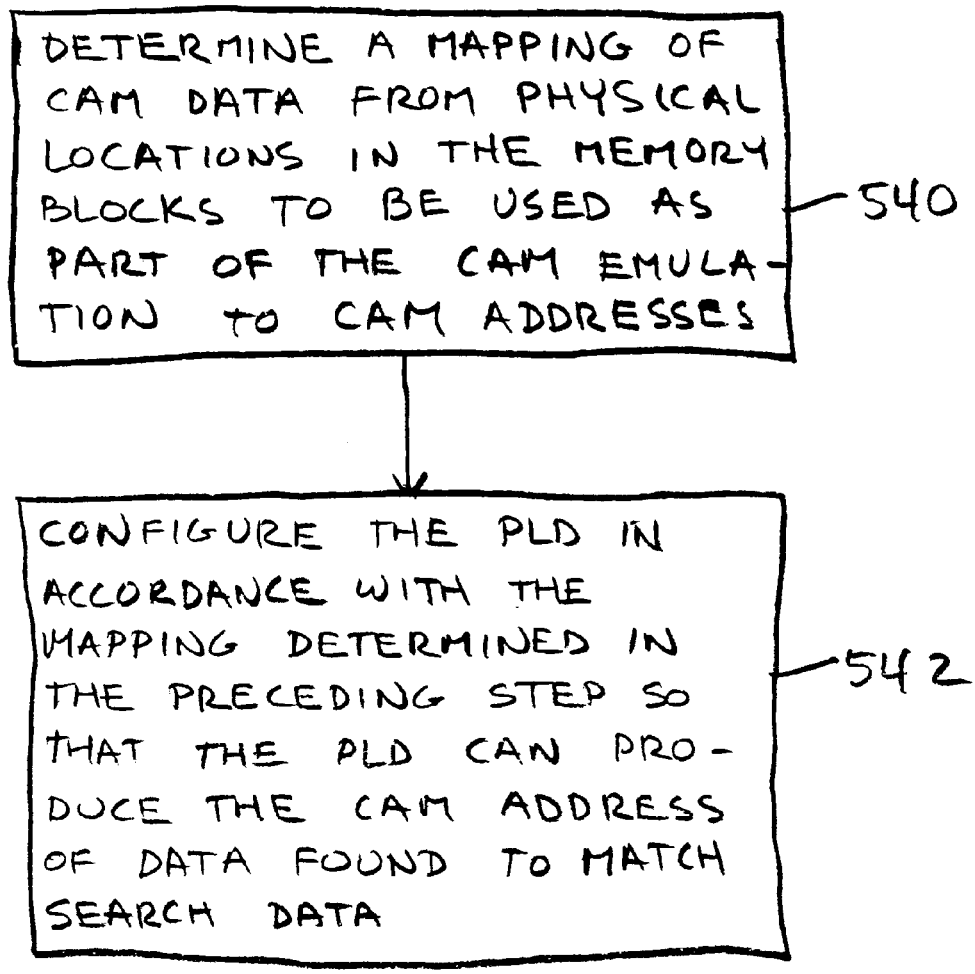
FIG. 10 is again similar to FIGS. 6–8 and shows some more optional steps that can be included in methods of the type illustrated by FIGS. 6–8 in accordance with the invention.
Figure 11:
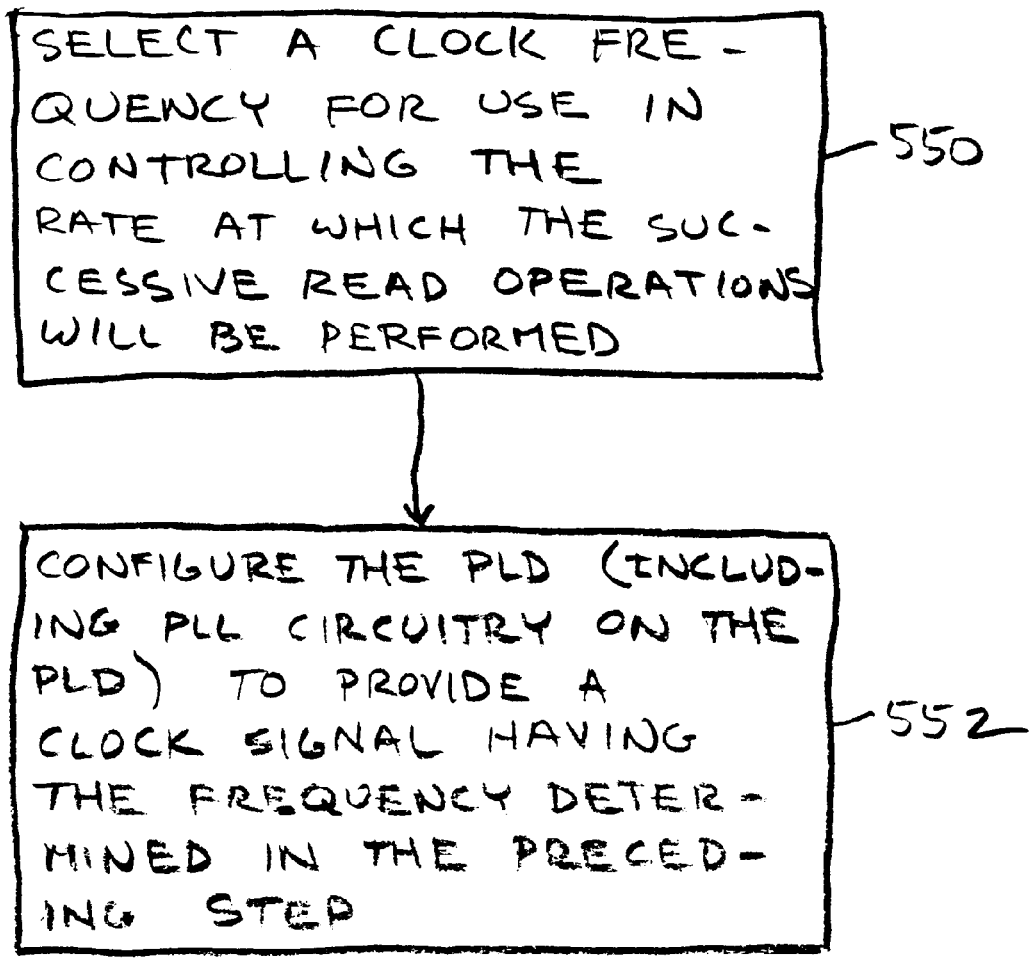
FIG. 11 is once again similar to FIGS. 6–8 and shows still more optional steps that can be included in methods of the type illustrated by FIGS. 6–8 in accordance with the invention.

Illustrative methods in accordance with the invention are shown in FIGS. 6–11. For example, FIGS. 6–8 collectively show one illustrative method of configuring and then operating a PLD in order to emulate a CAM in accordance with the invention. FIGS. 9–11 show various other steps that can be added to what is shown in FIGS. 6–8, if desired.

In FIG. 6 an illustrative method begins with step 502 in which the number of successive memory read operations that can be allowed for a CAM search is determined. This determination can be made on a basis like that shown in line 9 in FIG. 1a.

In step 504 the required, collective, usable, output port width of the memory blocks that will be used in the CAM emulation is determined. This determination can be made on a basis like that shown in line 10 in FIG. 1b.

In steps 506 and 510 the number of blocks of memory needed in the CAM emulation is determined. This determination can be made on a basis like that shown in line 12 in FIG. 1b. Step 506 is analogous to the first term in the formulas in line 12 in FIG. 1b. Step 510 is analogous to the multiplier that comes from the second term in line 12 in FIG. 1b.

In step 512 the number of parallel comparators (e.g., in element 60 (FIG. 3) or element 160 (FIG. 5)) is determined. This determination can be made on the basis of how many search words wide the variable W in line 10 in FIG. 1b is. Another way to say this is that the required number of parallel comparators is given by the quotient of the number of bits in W divided by the number of bits in a search word.

In step 520 the PLD is configured (i.e., programmed) in accordance with the preceding steps. Examples of configured PLDs 10 have been shown in FIGS. 3 and 5. The method steps discussed thus far provide elements like 40, 50, and 60 in FIG. 3 or elements like 140, 150, and 160 in FIG. 5 on the PLD.

In step 522 the PLD configured in accordance with the preceding steps is operated to emulate a CAM.

If it is desired to provide a CAM emulation in which it is additionally possible to be able to update and write CAM data into the memory blocks of the emulation, then the steps shown in FIGS. 6–8 may be augmented with the additional steps shown in FIG. 9. For example, the FIG. 9 steps may be performed between steps 520 and 522 in FIG. 8.

In step 530 a mapping of the CAM data from a CAM address regime to physical locations in the memory blocks of the CAM emulation is determined.

In step 532 the PLD is configured (i.e., programmed) to implement the mapping determined in step 530. This gives the PLD elements like 30 in FIG. 3 or 130 in FIG. 5.

The basic method of FIGS. 6–8 can also include steps such as are shown in FIG. 10 to give the CAM emulation the ability to provide the CAM address of CAM data that is found to match the search data. Again, the steps of FIG. 10 can be included between steps 520 and 522 in FIG. 8 if desired.

In step 540 a mapping from physical locations in the CAM emulating memory blocks to CAM addresses is determined. As has been said in connection with FIGS. 3 and 5, this mapping can be essentially the reverse of the mapping provided by elements 30 and 130 in those FIGS.

In step 542 the PLD is configured (i.e., programmed) to implement the mapping determined in step 540. This gives the PLD elements like 70 in FIG. 3 or 170 in FIG. 5.

As yet another example of possible augmentation of the basic method shown in FIGS. 6–8, FIG. 11 shows illustrative steps for selecting a CCLK (FIG. 1b) signal frequency and for configuring the PLD to provide such a CCLK signal. Again, the steps shown in FIG. 11 can be included between steps 520 and 522 in FIG. 8 if desired.

In step 550 a CCLK signal frequency is selected. The basis of this selection can be as shown in line 13 in FIG. 1b.

In step 552 the PLD is configured to give it circuitry for providing the desired CCLK signal (e.g., such as element 20 in FIG. 3 or element 120 in FIG. 5).

Figure 12:
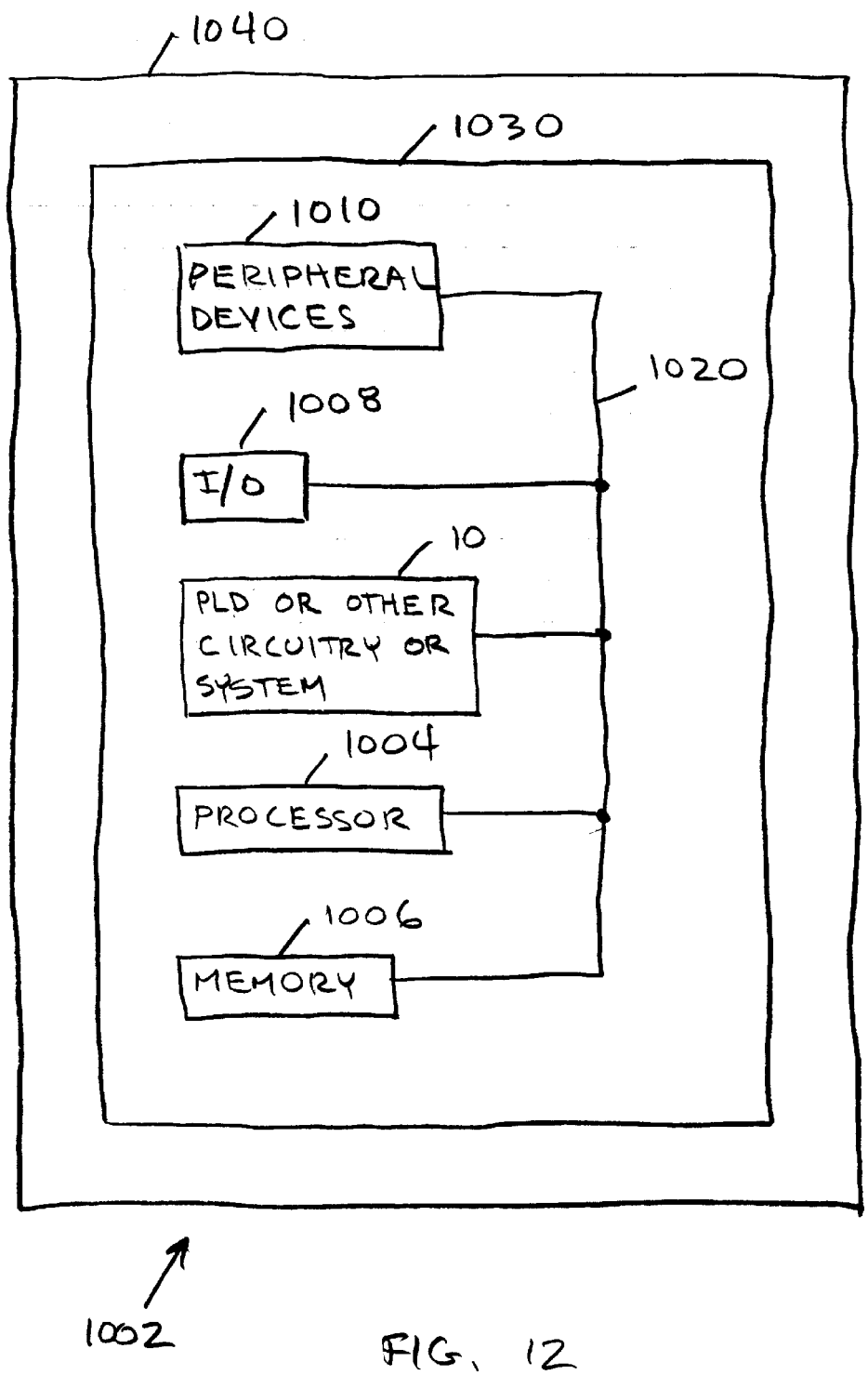
FIG. 12 is a simplified block diagram of an illustrative system employing circuitry in accordance with the invention.

FIG. 12 illustrates a PLD 10 (or other circuitry such as an ASIC or a multi-chip memory system) including a CAM emulation in accordance with this invention in a data processing system 1002. Data processing system 1002 may include one or more of the following components: a processor 1004; memory 1006; I/O circuitry 1008; and peripheral devices 1010. These components are coupled together by a system bus or other interconnections 1020 and are populated on a circuit board 1030 that is contained in an end-user system 1040.

System 1002 can be used in a wide variety of applications, such as computer networking, data networking, instrumentation, video processing, digital signal processing, or any other application where the advantage of using programmable or reprogrammable logic is desirable. Circuitry 10 can be used to perform a variety of different logic functions. For example, circuitry 10 can be configured as a processor or controller that works in cooperation with processor 1004. Circuitry 10 may also be used as an arbiter for arbitrating access to a shared resource in system 1002. In yet another example, circuitry 10 can be configured as an interface between processor 1004 and one of the other components in system 1002. It should be noted that system 1002 is only exemplary, and that the true scope and spirit of the invention should be indicated by the following claims.

It will be understood that the foregoing is only illustrative of the principles of the invention, and that various modifications can be made by those skilled in the art without departing from the scope and spirit of the invention. For example, the 512-bit memory block size mentioned in connection with the illustrative CAM simulations of FIGS. 2a–5 is only one possible memory block size, and any other size (e.g., 4K bits) can be used instead if desired. Similarly, the memory block read and write port widths mentioned in the examples are only illustrative, and any other memory block port widths can be used instead if desired. As just one example of this, 4K memory blocks with 32-bit parallel output ports can be used instead of the memory blocks with 16-bit wide output ports mentioned in the examples. The specific clock speeds mentioned herein are only illustrative, and any other faster or slower clock speeds can be used instead if desired. The use of PLL circuitry to generate the CCLK signal is optional, and any other suitable CCLK signal source can be used instead if desired. Although the drawings show simulated CAMs into which data can be written, the invention is equally applicable to read-only CAMs (which would not need elements like 30/130). Still other variations will occur to those skilled in the art.

What is claimed is:

1. Circuitry for emulating a content addressable memory containing a plurality of data words having respective CAM addresses, the circuitry including a plurality of blocks of memory and being configured to comprise:

a plural number of the memory blocks readable in parallel, the plural number being selected so that the data words can be read out of the memory blocks in a plurality of successive subpluralities of the data words within a time limit allowed for completion of a search; and a plurality of comparator circuits operable in parallel, each being adapted to compare a search word to a respective one of the data words in each of the subpluralities of the data words.

2. The circuitry defined in claim 1 being further configured to further comprise:

subcircuitry responsive to the comparator circuits and adapted to output a CAM address of a data word indicated by any of the comparator circuits to match the search word.

3. The circuitry defined in claim 2 being further configured so that the subcircuitry responsive to the comparator circuits comprises:
further subcircuitry adapted to base the CAM address on the location in the plural number of the memory blocks at which the data word indicated to match the search word is found.

4. The circuitry defined in claim 1 being further configured to further comprise:
subcircuitry adapted to route and remap CAM data words to various physical locations in the plural number of the memory blocks based on CAM address information associated with the CAM data words, the physical locations having an addressing scheme that is different from the CAM address information.

5. The circuitry defined in claim 1 being further configured to further comprise:
PLL circuitry adapted to produce a clock signal having a selectable frequency for use in controlling the rate at which the successive subpluralities of the data words are read from the plural number of the memory blocks.

6. A digital processing system comprising:
processing circuitry;
a memory coupled to said processing circuitry; and
circuitry as defined in claim 1 coupled to the processing circuitry and the memory.

7. A printed circuit board on which is mounted circuitry as defined in claim 1.

8. The printed circuit board defined in claim 7 further comprising:
a memory mounted on the printed circuit board and coupled to the circuitry.

9. The printed circuit board defined in claim 7 further comprising:
processing circuitry mounted on the printed circuit board and coupled to the circuitry.

10. The circuitry defined in claim 1 wherein the circuitry comprises:
a programmable logic device.

11. The circuitry defined in claim 1 wherein each of the memory blocks is a single-port memory block.

12. The circuitry defined in claim 1 wherein each of the memory blocks is a dual-port memory block.

13. The circuitry defined in claim 1 wherein each of the memory blocks is a RAM block.

14. The circuitry defined in claim 1 wherein each of the memory blocks is a ROM block.

15. A method of emulating a content addressable memory that contains a plurality of data words having respective CAM addresses in circuitry that includes a plurality of memory blocks, said method comprising:
determining a first number of successive memory accesses that can be allowed for searching the contents of the content addressable memory;
distributing the contents of the content addressable memory among a second plural number of the plurality of memory blocks, the second number being selected so that the entire contents of the content addressable memory can be read from the second plural number of the plurality of memory blocks using a number of successive accesses that does not exceed the first number; and
comparing to search data the data read from the second plural number of the plurality of memory blocks during each of the successive accesses to identify data that matches the search data.

16. The method defined in claim 15 further comprising:
producing a CAM address associated with the data that matches the search data.

17. The method defined in claim 16 wherein the producing comprises:
basing the CAM address on the location in the second plural number of the plurality of memory blocks at which the data that matches the search data is found.

18. The method defined in claim 15 further comprising:
routing CAM data to various locations in the second plural number of the plurality of memory blocks based on CAM address information associated with the CAM data.

19. The method defined in claim 15 further comprising:
selecting a rate for performance of the successive accesses.

20. The method defined in claim 15 wherein the comparing further comprises:
performing a third plural number of substantially simultaneous comparisons of the search data to data read from the second plural number of the plurality of memory blocks during each of the successive accesses, the third number being the quotient of how many data bits are read from the second plural number of the plurality of memory blocks during each of the successive accesses divided by how many data bits are in the search data.

21. The method defined in claim 15 wherein, if the first number is greater than is required to read all data from a representative one of the second plural number of the plurality of memory blocks, then the distributing further comprises:
using a first subplurality of the second plural number of the plurality of memory blocks for data that is read during an initial portion of the first number of successive accesses; and
using a second subplurality of the second plural number of the plurality of memory blocks for data that is read during a subsequent portion of the first number of successive accesses.

22. A method of using circuitry to emulate a content addressable memory that contains a plurality of data words having respective CAM addresses, said method comprising:
determining a first number of successive memory read operations that can be allowed for searching the contents of the content addressable memory;
configuring the circuitry so that the contents of the content addressable memory are distributed among a second plural number of memory blocks in the circuitry, the second number being selected so that the entire contents of the content addressable memory can be read from the second plural number of memory blocks in a number of successive read operations that does not exceed the first number; and
further configuring the circuitry to compare to search data the data read from the second plural number of memory blocks during each of the successive read operations to identify data that matches the search data.

23. The method defined in claim 22 further comprising:
further configuring the circuitry to produce a CAM address associated with the data that matches the search data.

24. The method defined in claim 23 wherein the further configuring the circuitry to produce a CAM address comprises:
configuring the circuitry to base the CAM address on the location in the second plural number of memory blocks at which the data that matches the search data is found.

25. The method defined in claim 22 further comprising:
further configuring the circuitry to route CAM data to various locations in the second plural number of memory blocks based on CAM address information associated with the CAM data.

26. The method defined in claim 22 further comprising:
configuring the circuitry to perform the successive read operations at a selectable rate.

27. The method defined in claim 22 wherein the configuring the circuitry to compare comprises:
configuring the circuitry to make a third plural number of substantially simultaneous comparisons of the search data to data read from the second plural number of memory blocks during each of the successive read operations, the third number being the quotient of how many data bits are read from the second plural number of memory blocks during each of the successive read operations divided by how many data bits are in the search data.

28. The method defined in claim 22 wherein, if the first number is greater than is required to read all data from a representative one of the second plural number of memory blocks, then the configuring the circuitry so that the contents of the content addressable memory are distributed comprises:
configuring the circuitry so that a first subplurality of the second plural number of memory blocks are read during an initial portion of the first number of successive read operations, and so that a second subplurality of the second plural number of memory blocks are read during a subsequent portion of the first number of successive read operations.

* * * * *